(12) United States Patent
Chen

(10) Patent No.: US 12,066,956 B2
(45) Date of Patent: Aug. 20, 2024

(54) SEMICONDUCTOR DEVICE, DATA STORAGE SYSTEM AND METHOD FOR CONTROLLING TERMINATION CIRCUITS

(71) Applicant: Realtek Semiconductor Corp., HsinChu (TW)

(72) Inventor: Tsan-Lin Chen, HsinChu (TW)

(73) Assignee: Realtek Semiconductor Corp., HsinChu (TW)

( * ) Notice: Subject to any disclaimer, the term of this patent is extended or adjusted under 35 U.S.C. 154(b) by 182 days.

(21) Appl. No.: 17/858,090

(22) Filed: Jul. 6, 2022

(65) Prior Publication Data

US 2023/0033739 A1 Feb. 2, 2023

(30) Foreign Application Priority Data

Aug. 2, 2021 (TW) ................... 110128265

(51) Int. Cl.
*G06F 13/16* (2006.01)
*G11C 7/10* (2006.01)
*G11C 16/04* (2006.01)

(52) U.S. Cl.
CPC ........ *G06F 13/1668* (2013.01); *G11C 7/1048* (2013.01); *G11C 16/0483* (2013.01)

(58) Field of Classification Search
CPC ........................... G06F 13/1668; G11C 7/1048
USPC ....................................................... 710/308
See application file for complete search history.

(56) References Cited

U.S. PATENT DOCUMENTS

| | | | |
|---|---|---|---|
| 10,171,078 B2 | 1/2019 | Kim | |
| 2004/0228196 A1* | 11/2004 | Kwak | G11C 5/063 365/230.03 |
| 2005/0268059 A1* | 12/2005 | LaBerge | G06F 13/4086 711/170 |
| 2006/0126401 A1* | 6/2006 | Ba | G11C 7/1051 365/189.05 |
| 2007/0030030 A1* | 2/2007 | Waldrop | G11C 7/1051 326/93 |
| 2009/0256587 A1* | 10/2009 | Kuboyama | G11C 29/50008 326/30 |
| 2010/0232196 A1 | 9/2010 | Jo | |
| 2014/0112084 A1 | 4/2014 | Shaeffer | |
| 2017/0005657 A1* | 1/2017 | Kim | H03K 19/0005 |
| 2017/0125092 A1* | 5/2017 | Hirashima | G11C 13/004 |
| 2019/0392886 A1* | 12/2019 | Cox | G11C 11/4093 |

* cited by examiner

*Primary Examiner* — Paul R. Myers
(74) *Attorney, Agent, or Firm* — Winston Hsu

(57) ABSTRACT

A semiconductor device includes a controller circuit and a signal generating circuit. The controller circuit is coupled to a plurality of memory devices and configured to generate a plurality of chip enable signals. One of the chip enable signals is provided to one of the memory devices, so as to respectively enable the corresponding memory device. The signal generating circuit is disposed outside of the controller circuit and configured to receive the chip enable signals and generate a termination circuit enable signal according to the chip enable signals. The termination circuit enable signal is provided to the memory devices. When a state of any of the chip enable signals is set to an enabled state, a state of the termination circuit enable signal generated by the signal generating circuit is set to an enabled state.

14 Claims, 3 Drawing Sheets

SEMICONDUCTOR DEVICE, DATA STORAGE SYSTEM AND METHOD FOR CONTROLLING TERMINATION CIRCUITS

BACKGROUND OF THE INVENTION

1. Field of the Invention

The invention relates to a circuit design in a semiconductor device, in particular to a circuit design with reduced reflected wave interference between a memory device and a memory controller.

2. Description of the Prior Art

In order to effectively reduce the influence of the reflected wave of the signal on the device, the termination resistance must be matched between the two devices. For example, when the memory device and the memory controller operate at high speed, for example, at 200 megahertz (MHz) or higher, the termination resistor must be turned on at both the memory controller side and the memory device side. When the termination resistors at both sides are matched, the reflected wave of the signal can be effectively reduced to achieve high-speed and low-interference access operation.

Generally, in order to improve the access efficiency, a memory controller may be connected to a plurality of memory devices at the same time, and the plurality of memory devices are commonly connected to the memory controller through a shared bus. In this case, the access operation of the memory controller to the operating memory device may also be disturbed by the non-operating memory device due to the sharing of the bus, since there will be a small amount of reflected waves generated on the shared bus. In particular, when the operation speed of the memory device is increased, the interference caused by the reflected waves of transmitted signals becomes more serious, resulting in that even small reflected waves have to be processed.

Therefore, a novel design of a semiconductor device or a circuit design suitable for a semiconductor device to reduce the interference of reflected wave caused by the non-operating memory device is highly required.

SUMMARY OF THE INVENTION

It is an objective of the invention to provide a circuit design suitable for a semiconductor device to reduce the interference of reflected wave caused by the non-operating memory device.

According to an embodiment of the invention, a semiconductor device comprises a controller circuit and a signal generating circuit. The controller circuit is coupled to a plurality of memory devices and configured to generate a plurality of chip enable signals, wherein one of the chip enable signals is provided to one of the memory devices, so as to respectively enable the corresponding memory device. The signal generating circuit is disposed outside of the controller circuit and configured to receive the chip enable signals and generate a termination circuit enable signal according to the chip enable signals. The termination circuit enable signal is provided to the memory devices. When a state of any of the chip enable signals is set to an enabled state, a state of the termination circuit enable signal generated by the signal generating circuit according to the chip enable signals is set to an enabled state.

According to another embodiment of the invention, a data storage system comprises a controller circuit, a plurality of memory devices and a signal generating circuit. The controller circuit is configured to generate a plurality of chip enable signals and transmit a plurality of access signals through a bus. The memory devices are commonly coupled to the bus. Each memory device is configured to receive one of the chip enable signals and a termination circuit enable signal and is selectively enabled, in response to a state of received chip enable signal, to receive the access signals from the controller circuit through the bus. Each memory device is configured to determine whether to turn on an internal termination circuit according to a state of the termination circuit enable signal. The signal generating circuit is configured to receive the chip enable signals and generate the termination circuit enable signal according to the chip enable signals. When the state of any of the chip enable signals is set to an enabled state, the state of the termination circuit enable signal is set to an enabled state.

According to yet another embodiment of the invention, a method for controlling termination circuits comprises: receiving a plurality of chip enable signals from a controller circuit by a signal generating circuit, wherein one of the chip enable signals is provided to one of a plurality of memory devices; generating a termination circuit enable signal by the signal generating circuit according to the chip enable signals, wherein the termination circuit enable signal is provided to the memory devices; and controlling an internal termination circuit by each memory device according to a state of received chip enable signal and/or a state of the termination circuit enable signal.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
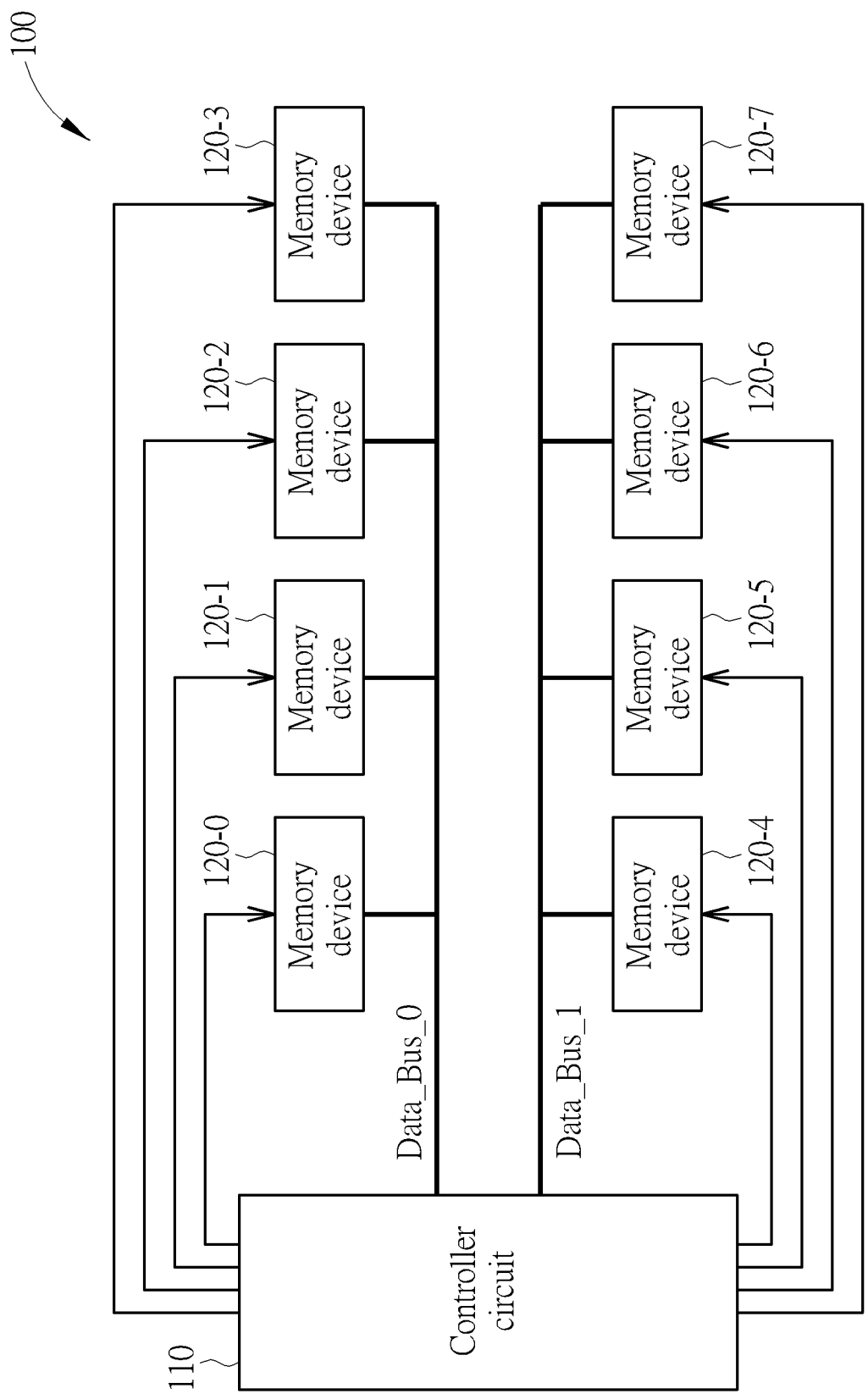
FIG. 1 shows an exemplary block diagram of a data storage system according to an embodiment of the invention.

FIG. 1 shows an exemplary block diagram of a data storage system according to an embodiment of the invention. The data storage system 100 may comprise a controller circuit 110 and a plurality of memory devices 120-0~120-3 and 120-4~120-7. The data storage system 100 may have a multi-channel architecture, which may comprise a first channel composed of memory devices 120-0~120-3, and a second channel composed of memory devices 120-4~120-7. The controller circuit 110 is coupled to the memory devices 120-0~120-3 through the bus Data_Bus_0, and is coupled to the memory devices 120-4~120-7 through the bus Data_Bus_1. Therefore, the bus Data_Bus_0 in the first channel is shared by the memory devices 120-0~120-3, and the bus Data_Bus_1 in the second channel is shared by the memory devices 120-4~120-7. The controller circuit 110 transmits a plurality of access signals, such as access commands or read/write data, through the shared bus to the memory devices 120-0~120-3 and the memory devices 120-4~120-7.

The controller circuit may generate a plurality of chip enable signals. Each chip enable signal is provided to one of the memory devices 120-0~120-7 for selectively enabling the corresponding memory device. For one channel, the controller circuit 110 may enable one memory device at one time and may notify/enable the memory device through the corresponding chip enable signal. The enabled memory device is the operating memory device and has the right to access the corresponding bus. Therefore, the controller circuit 110 is able to perform access operations to access the operating memory device, transmit signals to the operating memory device and/or receive signals from the operating memory device through the bus. On the other hand, the memory devices arranged in the same channel but not being enabled are the non-operating memory devices, and the non-operating memory devices do not have the right to access the bus.

As mentioned above, although the non-operating memory device does not have the right to access the bus, reflected waves will still be generated by the non-operating memory device since the non-operating memory device is also coupled to the same bus. Therefore, not only the operating memory device itself, but also the non-operating memory device generates reflected waves to interfere the operating memory device. The reason why the non-operating memory device still generates reflected waves is that, the signal transmitted on the bus not only propagates to the operating memory device but also propagates to the non-operating memory device since the bus is shared among the memory devices in the same channel, and then a small amount of reflected wave will be generated by the signal propagated to the non-operating memory device. Such reflected wave will interfere the signals transmitted between the controller circuit 110 and the operating memory device. Therefore, in the multi-channel architecture with shared bus, not only the operating memory device but also the non-operating memory device should be notified about when to turn on the internal termination circuit, as an example, at least one termination resistor, so as to reduce or improve the generation of small amount of reflected wave that will interfere the operating memory device due to the non-operating memory device.

Figure 2:
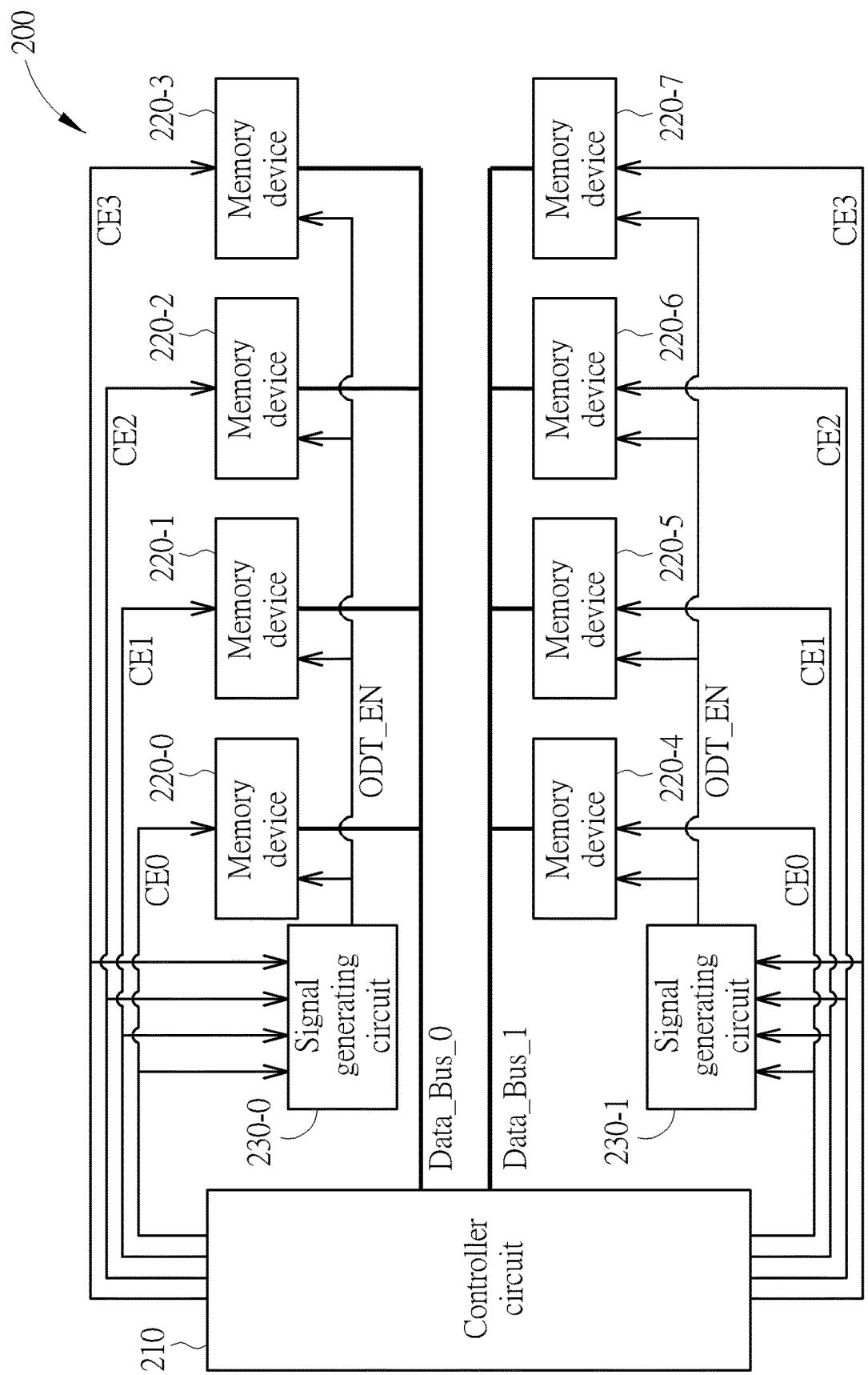
FIG. 2 shows an exemplary block diagram of a data storage system according to another embodiment of the invention.

FIG. 2 shows an exemplary block diagram of a data storage system according to another embodiment of the invention. The data storage system 200 may comprise a controller circuit 210 and a plurality of memory devices 220-0~220-3 and 220-4~220-7. The data storage system 200 may have a multi-channel architecture, which may comprise a first channel composed of memory devices 220-0~220-3, and a second channel composed of memory devices 220-4~220-7. The controller circuit 210 is coupled to the memory devices 220-0~220-3 through the bus Data_Bus_0, and is coupled to the memory devices 220-4~220-7 through the bus Data_Bus_1. That is, the memory devices 220-0~220-3 are commonly coupled to the Data_Bus_0. Therefore, the bus Data_Bus_0 in the first channel is shared by the memory devices 220-0~220-3. Likewise, the memory devices 220-4~220-7 are commonly coupled to the Data_Bus_1. Therefore, the bus Data_Bus_1 in the second channel is shared by the memory devices 220-4~220-7.

According to an embodiment of the invention, the controller circuit 210 may be a flash memory controller, such as a NAND-type flash memory controller, and the memory devices 220-0~220-7 may be flash memory devices, such as NAND-type flash memory devices. Each of the memory devices 220-0~220-7 may be a memory chip or die, and each of the memory devices 220-0 to 220-7 may comprise a built-in internal termination circuit (not shown in FIG. 2), as an example, the On Die Termination (ODT). According to an embodiment of the invention, the internal termination circuit comprised in each of the memory devices 220-0~220-7 may comprise at least one termination resistor, and the termination resistor may have more than one selectable gear, for providing different values of impedance as an option.

The controller circuit 210 may generate a plurality of chip enable signals, and each chip enable signal may be provided to at least one of the memory devices 220-0 to 220-7 for selectively enabling the corresponding memory device. For example, the chip enable signal CE0 transmitted on the first channel is provided to the memory device 220-0, the chip enable signal CE1 transmitted on the first channel is provided to the memory device 220-1, and so on. Likewise, the chip enable signal CE0 transmitted on the second channel is provided to the memory device 220-4, the chip enable signal CE1 transmitted on the second channel is provided to the memory device 220-5, and so on.

As described above, for one channel, the controller circuit 210 may enable one memory device at one time and may notify/enable the memory device through the corresponding chip enable signal. As an example, the controller circuit 210 may set a state of the chip enable signal CE0 to an enabled state, as an example, by setting its voltage level to a logic high level, so as to respectively enable the memory devices 220-0 and 220-4. The enabled memory device is the operating memory device and has the right to access the corresponding bus.

Therefore, the controller circuit 210 is able to perform access operations to access the operating memory device, transmit signals to the operating memory device and/or receive signals from the operating memory device through the bus. On the other hand, the memory devices arranged in the same channel but not being enabled are the non-operating memory devices, and the non-operating memory devices do not have the right to access the bus. For example, the controller circuit 210 may set the state of the chip enable signals CE1~CE3 to a disabled state, as an example, by setting its voltage level to a logic low level, so as to respectively disable the memory devices 220-1~220-3 and memory devices 220-5~220-7. Disabled memory devices do not have the right to access the bus.

According to an embodiment of the invention, in order to effectively reduce the interference of the reflected wave generated due to the non-operating memory device without additionally increasing the number of control signals that the controller circuit 210 must output, the data storage system 200 may further comprise a signal generating circuit, for example, the signal generating circuits 230-0 and 230-1. The signal generating circuits 230-0 and 230-1 may be disposed outside the controller circuit 210 configured to receive the chip enable signals CE0-CE3 in the corresponding channels, and generate a termination circuit enable signal ODT_EN according to the chip enable signals CE0-CE3.

According to an embodiment of the invention, the termination circuit enable signal ODT_EN may be provided to each memory device, for example, the termination circuit enable signal ODT_EN in the first channel is provided to the memory devices 220-0~220-3, and the termination circuit enable signal ODT_EN in the second channel is provided to the memory devices 220-4 to 220-7.

According to an embodiment of the invention, when a state of any one of the chip enable signals CE0~CE3 is set to the enabled state (e.g., has a logic high level), a state of the termination circuit enable signal ODT_EN generated by the signal generating circuit 230-0 and/or the signal generating circuit 230-1 according to the chip enable signals CE0~CE3 will be set to an enabled state (e.g., has a logic high level). As used herein, "A and/or B" refers to any combination of one or more of the listed associated items (A, B) (e.g., A, B, or a combination of A and B).

According to an embodiment of the invention, each memory device may control the internal termination circuit thereof according to a state of the received chip enable signal and/or a state of the termination circuit enable signal ODT_EN. For example, in an embodiment of the invention, each memory device may determine whether to turn on its internal termination circuit according to a state of the termination circuit enable signal ODT_EN. When the state of the received termination circuit enable signal ODT_EN is set to the enabled state, the memory devices 220-0~220-3 and 220-4~220-7 may turn on the internal termination circuits comprised therein.

Therefore, in an embodiment of the invention, when a memory device in a channel is enabled in response to the corresponding chip enable signal and becomes an operating memory device, in order to eliminate the interference of reflected waves, all memory devices may turn on their internal termination circuits in response to the enabled state of the termination circuit enable signal ODT_EN as well.

According to another embodiment of the invention, the internal termination circuit in each of the memory devices 220-0~220-7 may comprise at least one termination resistor, and the termination resistor has more than one selectable gear, for providing different impedance values as an option. For example, the internal termination circuit in each of the memory devices 220-0~220-7 may comprise a variable resistor as the termination resistor, or may comprise a plurality of resistors with different resistance values as the termination resistor. In this embodiment, when the state of the received termination circuit enable signal ODT_EN is set to the enabled state, the memory devices 220-0~220-3 and the memory devices 220-4~220-7 may further select the gear of the internal termination circuit to be turned on according to the state of the respectively received chip enable signal.

To be more specific, the internal termination circuit may be selectively set to at least a first gear and a second gear, wherein the impedance provided by the internal termination circuit operating in the second gear is different from the impedance provided by the internal termination circuit operating in the first gear. For example, the impedance corresponding to the second gear may be lower than the impedance corresponding to the first gear. In the embodiment of the invention, for the operating memory device, the internal termination circuit may be set to a gear with higher impedance, for example, the first gear, so that relatively large resistance is provided when the internal terminal circuit operates. For the non-operating memory device, the internal termination circuit may be set to a gear with lower impedance level, for example, the second gear, so that relatively small impedance is provided when the internal terminal circuit operates.

Therefore, in this embodiment, as each memory device controls the internal termination circuit according to the state of the received chip enable signal and/or the state of the termination circuit enable signal ODT_EN, one memory device may turn on its internal termination circuit and set a gear of the internal termination circuit to a first gear when both the state of the chip enable signal (that is, one of the chip enable signals CE0~CE3) that it received and the state of the termination circuit enable signal ODT_EN are set to an enabled state, which means that the memory device is an operating memory device and has to turn on its internal termination circuit. On the other hand, when the state of the chip enable signal (that is, one of the chip enable signals CE0~CE3) that a memory device received is set to the disabled state and the state of the termination circuit enable signal ODT_EN is set to an enabled state, it means that the memory device is a non-operating memory device and has to turn on its internal termination circuit. For the non-operating memory device, the internal termination circuit may be turned on and set to a second gear having different impedance from the first gear.

According to an embodiment of the invention, one or more devices within the data storage system 200 may be arranged in a semiconductor device, for example, the controller circuit 210 and the signal generating circuits 230-0 and 230-1 may be arranged in inside a semiconductor device. Or, the controller circuit 210 and the signal generating circuits 230-0 and 230-1 may be as a whole regarded as a semiconductor device. In addition, according to an embodiment of the invention, the semiconductor device may further comprise a printed circuit board, and the controller circuit 210 and the signal generating circuits 230-0 and 230-1 are disposed on printed circuit board. The controller circuit 210 and the signal generating circuits 230-0 and 230-1 may be connected with other through the copper wires or traces on the printed circuit board. According to an embodiment of the invention, the signal generating circuits 230-0 and 230-1 may be connected to a plurality of chip enable signal output ports or output pins of the controller circuit 210 through the copper wires or traces on the printed circuit board, so as to receive the corresponding chip enable signals, such as the chip enable signals CE0~CE3.

According to an embodiment of the invention, the signal generating circuits 230-0 and 230-1 may respectively comprise one or more logic gates configured to receive the chip enable signals CE0~CE3 and generate the termination circuit enable signal ODT_EN by performing a logic operation based on the chip enable signals CE0~CE3. The type and number of said one or more logic gates may be flexibly selected based on whether the chip enable signals CE0~CE3 and the termination circuit enable signal ODT_EN are high active or low active. For example, in an embodiment of the invention, if the chip enable signals CE0~CE3 and the termination circuit enable signal ODT_EN are high active, the signal generating circuits 230-0 and 230-1 may respectively comprise an OR gate. The OR gate may comprise a plurality of input terminals, as an example, 4 input terminals, for receiving the chip enable signals CE0~CE3 from the controller circuit 210, and perform logic OR operation on the received chip enable signals CE0~CE3 to generate the termination circuit enable signal ODT_EN. If the chip enable signals CE0~CE3 are high active and the termination circuit enable signal ODT_EN is low active, the signal generating circuits 230-0 and 230-1 may respectively comprise a NOR gate configured to receive the chip enable signals CE0~CE3 from the controller circuit 210 and perform logic NOR operation on the received chip enable signals CE0~CE3 to generate the termination circuit enable signal ODT_EN.

It is to be noted that, in the embodiment of the invention, there is no need for the controller circuit 210 to add any circuits and output ports or output pins to output the termination circuit enable signal required by the memory devices. In the embodiments of the invention, the signal generating circuit may directly use the chip enable signals output by the controller circuit 210 to generate the termination circuit enable signal.

Compared with the design that requires the controller circuit to generate and output the termination circuit enable signal required by the memory devices, the advantage of the proposed circuit design is that the number of output ports or output pins of the controller circuit will not be increased as the number of channels increases, which can effectively reduce the manufacturing cost of the controller circuit.

Especially, in the multi-channel architecture, if the design of the data storage system requires the controller circuit to generate and output the termination circuit enable signal required by the memory devices, when the number of memory channels that the controller circuit is coupled to is increased, the number of output ports or output pins need to be added in the controller circuit is increased as well, which will greatly increase the manufacturing cost of the controller circuit.

Therefore, the proposed circuit design effectively solves the problem that the manufacturing cost of the controller circuit increases as the number of memory channels increases. Based on the proposed circuit design, since the termination circuit enable signal may be directly generated by using the existing chip enable signals, there is no need to add any circuits and output ports or output pins in the controller circuit 210 to output the termination circuit enable signal required by memory devices.

Figure 3:
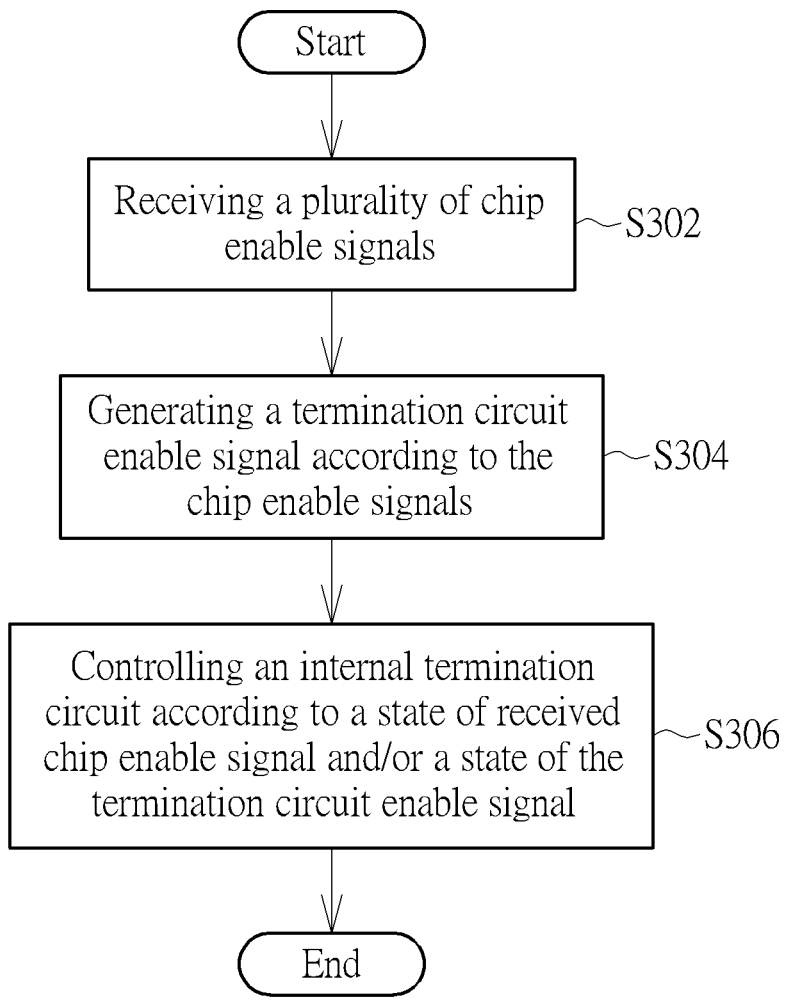
FIG. 3 shows a flow chart of a method for controlling termination circuits according to an embodiment of the invention.

FIG. 3 shows a flow chart of a method for controlling termination circuits according to an embodiment of the invention. The method may be applied in the aforementioned semiconductor device and/or data storage system and may comprise the following steps:

Step S302: receiving a plurality of chip enable signals from a controller circuit by a signal generating circuit. As described above, one of the chip enable signals is provided to one of a plurality of memory devices for enabling or disabling the corresponding memory device, e.g. the corresponding memory device may be enabled or disabled responsive to the state set to the received chip enable signal.

Step S304: generating a termination circuit enable signal by the signal generating circuit according to the chip enable signals. For example, the signal generating circuit may set the state of the termination circuit enable signal according to the states of the chip enable signals. In addition, the termination circuit enable signal may be provided to each memory device. As the exemplary block diagram shown in FIG. 2, the signal generating circuits may respectively generate the corresponding termination circuit enable signal for the memory devices in different channels according to the received chip enable signals and provide the termination circuit enable signal to memory devices in the corresponding channel.

Step S306: controlling an internal termination circuit by each memory device according to a state of received chip enable signal and/or a state of the termination circuit enable signal.

In an embodiment of the invention, each memory device may determine whether to turn on its internal termination circuit according to a state of the termination circuit enable signal ODT_EN. When the state of the termination circuit enable signal is set to an enabled state, the memory device may turn on its internal termination circuit. In another embodiment of the invention, each memory device may determine whether to turn on its internal termination circuit according to a state of the termination circuit enable signal ODT_EN and when the internal termination circuit is determined to be turned on, the memory may further select a gear for its internal termination circuit based on the state of the received chip enable signal. As described above, for the operating memory device, the internal termination circuit may be set to a gear with higher impedance, for example, the first gear, and for the non-operating memory device, the internal termination circuit may be set to a gear with lower impedance level, for example, the second gear. It is to be understood that, unless specifically stated, the sequence of the steps mentioned in the embodiments may be adjusted according to actual needs, and may even be performed simultaneously or partially simultaneously.

With the proposed circuit design, interference of the reflected waves generated due to the non-operating memory device is effectively reduced or improved, and the manufacturing cost of the controller circuit is effectively reduced as well or will not be increased.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor device, comprising:
   a controller circuit, coupled to a plurality of memory devices and configured to generate a plurality of chip enable signals, wherein one of the chip enable signals is provided to one of the memory devices, so as to respectively enable the corresponding memory device; and
   a signal generating circuit, disposed outside of the controller circuit and configured to receive the chip enable signals and generate a termination circuit enable signal according to the chip enable signals, wherein the termination circuit enable signal is provided to the memory devices, and
   when a state of any of the chip enable signals is set to an enabled state, a state of the termination circuit enable signal generated by the signal generating circuit according to the chip enable signals is set to an enabled state.

2. The semiconductor device of claim 1, wherein the controller circuit is coupled to the memory devices through a bus and the bus is shared by the memory devices.

3. The semiconductor device of claim 1, further comprising:
   a printed circuit board, wherein the controller circuit and the signal generating circuit are disposed on the printed circuit board.

4. The semiconductor device of claim 1, wherein the signal generating circuit comprises:
   a logic gate, configured to receive the chip enable signals and generate the termination circuit enable signal by performing a logic operation based on the chip enable signals.

5. The semiconductor device of claim 1, wherein an internal termination circuit in each memory device is turned on in response to the enabled state of the termination circuit enable signal.

6. The semiconductor device of claim 5, wherein a gear of the internal termination circuit in each memory device is selected according to the state of the chip enable signal received by the memory device.

7. A data storage system, comprising:
   a controller circuit, configured to generate a plurality of chip enable signals and transmit a plurality of access signals through a bus;
   a plurality of memory devices, commonly coupled to the bus, each memory device being configured to receive one of the chip enable signals and a termination circuit enable signal, each memory device being enabled, selectively in response to a state of received chip enable signal, to receive the access signals from the controller circuit through the bus and being configured to determine whether to turn on an internal termination circuit according to a state of the termination circuit enable signal; and a signal generating circuit, configured to receive the chip enable signals and generate the termination circuit enable signal according to the chip enable signals, wherein when the state of any of the chip enable signals is set to an enabled state, the state of the termination circuit enable signal is set to an enabled state.

8. The data storage system of claim 7, wherein when the state of termination circuit enable signal is set to the enabled state, the memory devices are further configured to respectively select a gear of the internal termination circuit according to the state of the received chip enable signal.

9. The data storage system of claim 7, further comprising:
a printed circuit board, wherein the controller circuit and the signal generating circuit are disposed on the printed circuit board.

10. The data storage system of claim 7, wherein the signal generating circuit comprises:
a logic gate, configured to receive the chip enable signals and generate the termination circuit enable signal by performing a logic operation based on the chip enable signals.

11. A method for controlling termination circuits, comprising:
receiving a plurality of chip enable signals from a controller circuit by a signal generating circuit, wherein one of the chip enable signals is provided to one of a plurality of memory devices;
generating a termination circuit enable signal by the signal generating circuit according to the chip enable signals, wherein the termination circuit enable signal is provided to the memory devices; and
controlling an internal termination circuit by each memory device according to a state of received chip enable signal and/or a state of the termination circuit enable signal;
wherein when the state of any of the chip enable signals is set to an enabled state, the state of the termination circuit enable signal is set to an enabled state.

12. The method of claim 11, wherein step of controlling the internal termination circuit by each memory device according to the state of the received chip enable signal and/or the state of the termination circuit enable signal further comprises:
turning on the internal termination circuit when the state of the termination circuit enable signal is set to an enabled state.

13. The method of claim 11, wherein step of controlling the internal termination circuit by each memory device according to the state of the received chip enable signal and/or the state of the termination circuit enable signal further comprises:
turning on the internal termination circuit and setting a gear of the internal termination circuit to a first gear when both the state of the termination circuit enable signal and the state of the received chip enable signal are set to an enabled state.

14. The method of claim 13, wherein step of controlling the internal termination circuit by each memory device according to the state of the received chip enable signal and/or the state of the termination circuit enable signal further comprises:
turning on the internal termination circuit and setting the gear of the internal termination circuit to a second gear when the state of the termination circuit enable signal is set to the enabled state and the state of the received chip enable signal is set to a disabled state,
wherein an impedance provided by the internal termination circuit operating in the second gear is different from an impedance provided by the internal termination circuit operating in the first gear.

* * * * *